(12) United States Patent
Bautista, Jr. et al.

(10) Patent No.: US 6,771,093 B1
(45) Date of Patent: Aug. 3, 2004

(54) IMPLEMENTING REFERENCE CURRENT MEASUREMENT MODE WITHIN REFERENCE ARRAY PROGRAMMING MODE OR REFERENCE ARRAY ERASE MODE IN A SEMICONDUCTOR

(75) Inventors: Edward V. Bautista, Jr., Santa Clara, CA (US); Ken Cheong Cheah, Penang (MY); Weng Fook Lee, Penang (MY)

(73) Assignee: Advanced Micro Devices, Inc., Sunnyvale, CA (US)

( * ) Notice: Subject to any disclaimer, the term of this patent is extended or adjusted under 35 U.S.C. 154(b) by 79 days.

(21) Appl. No.: 10/254,381

(22) Filed: Sep. 25, 2002

(51) Int. Cl.[7] .............................................. H03K 19/00
(52) U.S. Cl. ........................ 326/16; 326/38; 324/765
(58) Field of Search .............................. 326/16, 37–41; 324/765

(56) References Cited

U.S. PATENT DOCUMENTS 6,265,859 B1 * 7/2001 Datar et al. .................. 323/315
6,329,831 B1 * 12/2001 Bui et al. ..................... 324/765
6,612,737 B1 * 9/2003 Lobban ........................ 374/183

* cited by examiner

Primary Examiner—Don Le

(57) ABSTRACT

A method of implementing a reference current measurement mode within a reference array programming mode or a reference array erase mode in a semiconductor chip is disclosed. This implementation leads to significant reduction in testing time for the semiconductor chip, increasing production volume and revenues.

21 Claims, 3 Drawing Sheets

US 6,771,093 B1

IMPLEMENTING REFERENCE CURRENT MEASUREMENT MODE WITHIN REFERENCE ARRAY PROGRAMMING MODE OR REFERENCE ARRAY ERASE MODE IN A SEMICONDUCTOR

BACKGROUND OF THE INVENTION

1. Field of the Invention

The present invention generally relates to test modes of semiconductor chips. More particularly, the present invention relates to the field of enabling a reference current measurement mode.

2. Related Art

The fabrication of semiconductor chips is a complex, expensive, and time-consuming task. A considerable amount of time is dedicated to testing the semiconductor chips. This testing occurs during a period known as sort or backend processing. The testing time for a semiconductor chip is carefully controlled because of several reasons. Production volume is affected by the testing time. In particular, a decrease in testing time increases production volume, positively affecting revenues. Conversely, an increase in testing time decreases production volume, negatively affecting revenues.

A number of tasks are performed during the testing of the semiconductor chip. Typically, the semiconductor chip is operated in a variety of test modes during the testing time. Typically, each test mode is individually invoked by performing a particular procedure. Another procedure is performed to exit the test mode. Generally, the currently active test mode is exited before another test mode is invoked.

Each test mode serves a particular purpose. For example, during testing a flash memory chip is typically operated in numerous test modes such as a reference current measurement mode, a reference array programming mode, and a reference array erase mode. These test modes facilitate parameter control and parameter characterization (e.g., threshold voltage $V_t$) of an array of reference cells of the flash memory chip. Typically, the parameter characteristics of the memory cells of the flash memory chip are compared to the parameter characteristics of the array of reference cells to perform an operation such as a read operation.

Continuing, the reference array programming mode enables the threshold voltage $V_t$ of an array of reference cells of the flash memory chip to be programmed. The reference array erase mode enables the threshold voltage $V_t$ of the array of reference cells of the flash memory chip to be erased. Moreover, the reference current measurement mode enables the determination of the value of the threshold voltage $V_t$ of the array of reference cells of the flash memory chip by measuring a current flowing through the reference cells.

For instance, after the array of reference cells are programmed using the reference array programming mode, the reference array programming mode is exited so that the reference current measurement mode can be invoked to determine the value of the threshold voltage $V_t$ of the array of reference cells. In order to exit the reference array programming mode, high voltages applied to the flash memory chip so that to invoke the reference array programming mode need to be reset. Moreover, a test code corresponding to the reference current measurement mode needs to be provided to the flash memory chip. If the threshold voltage $V_t$ of the array of reference cells does not reach the desired level, the reference array programming mode needs to be re-invoked. This requires the inputting of a test code corresponding to the reference array programming mode and applying high voltages to the flash memory chip. This process may continue several more times. A similar situation exists after the array of reference cells is erased using the reference array erase mode. In sum, the conventional procedures for transitioning between the reference array programming mode and the reference current measurement mode and for transitioning between the reference array erase mode and the reference current measurement mode are tedious and inefficient.

SUMMARY OF THE INVENTION

A method of implementing a reference current measurement mode within a reference array programming mode or a reference array erase mode in a semiconductor chip is disclosed. This implementation leads to significant reduction in testing time for the semiconductor chip, increasing production volume and revenues.

In particular, either the reference array programming mode or the reference array erase mode is invoked in the semiconductor chip. This requires the application of high voltages and a test code to the semiconductor chip. Within the reference array programming mode (if invoked), the state of the output enable bar signal (or /OE) is changed (or pulsed) from a first state to a second state to enable the reference current measurement mode while disabling the reference array programming mode. Similarly, within the reference array erase mode (if invoked), the state of the output enable bar signal (or /OE) is changed (or pulsed) from a first state to a second state to enable the reference current measurement mode while disabling the reference array erase mode. Thus, the reference current measurement mode is enabled without requiring the high voltages to be reset and without requiring the test code corresponding to the reference current measurement mode to be provided to the semiconductor chip.

Conversely, the state of the output enable bar signal (or /OE) is changed (or pulsed) from the second state to the first state to enable the reference array erase mode (if previously invoked) or the reference array programming mode (if previously invoked) while disabling the reference current measurement mode. Again, the reference current measurement mode is disabled without requiring the high voltages to be reapplied and without requiring the test code corresponding to the reference array erase mode or the reference array programming mode to be provided again to the semiconductor chip. In an embodiment, the first state is a logic "high" while the second state is a logic "low".

These and other advantages of the present invention will no doubt become apparent to those of ordinary skill in the art after having read the following detailed description of the preferred embodiments, which are illustrated in the drawing figures.

BRIEF DESCRIPTION OF THE DRAWINGS

The accompanying drawings, which are incorporated in and form a part of this specification, illustrate embodiments of the invention and, together with the description, serve to explain the principles of the present invention.

The drawings referred to in this description should not be understood as being drawn to scale except if specifically noted.

DETAILED DESCRIPTION OF THE INVENTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention.

A method of implementing a reference current measurement mode within a reference array programming mode or a reference array erase mode in a semiconductor chip is disclosed. This implementation leads to significant reduction in testing time for the semiconductor chip, increasing production volume and revenues. Although the description will focus on a flash memory chip, the present invention is equally applicable to other types of semiconductor chips.

Figure 1:
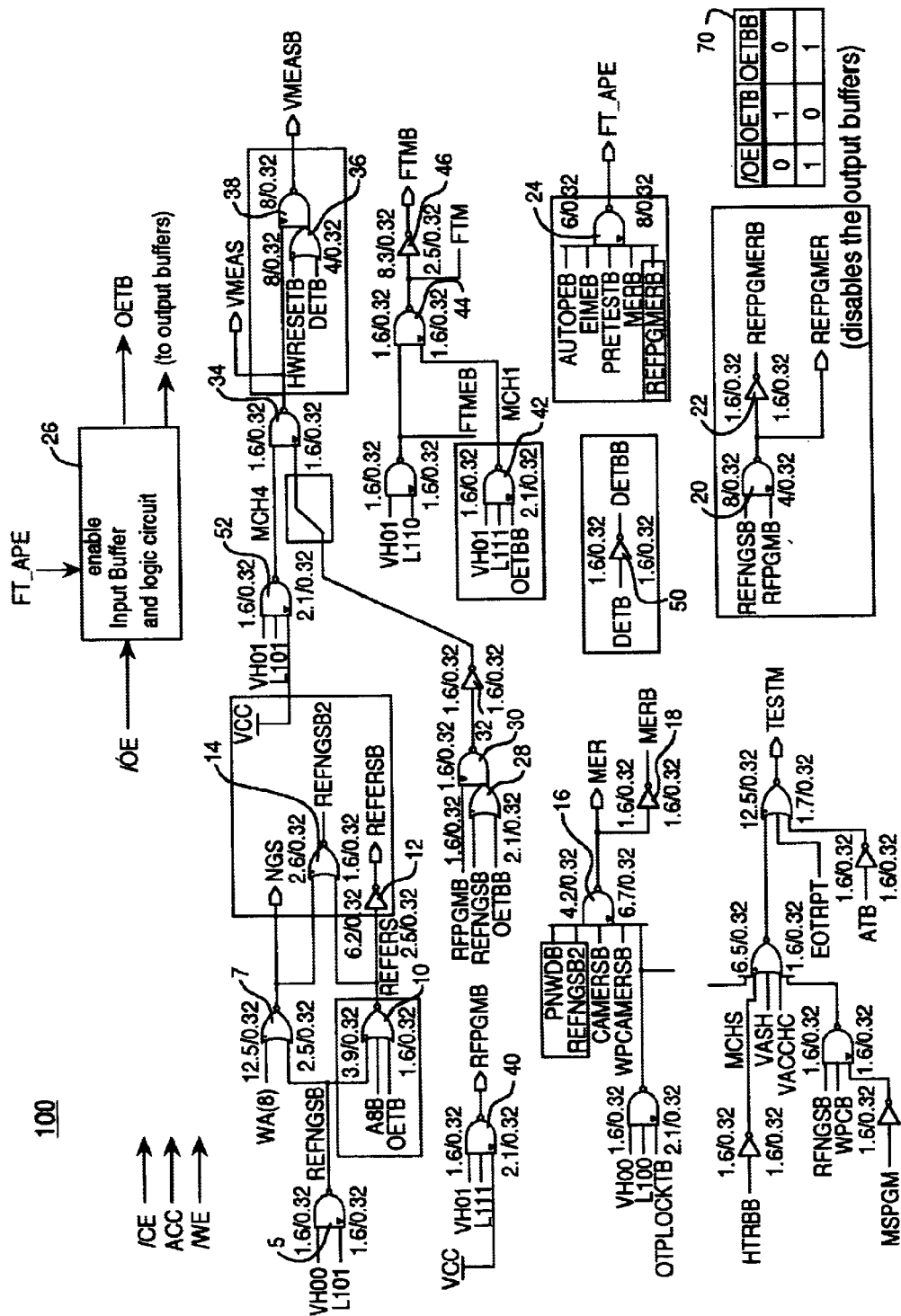
FIG. 1 illustrates a plurality of circuits for enabling several test modes implemented in a semiconductor chip in accordance with an embodiment of the present invention.

FIG. 1 illustrates a plurality of circuits for enabling several test modes implemented in a semiconductor chip 100 in accordance with an embodiment of the present invention. In an embodiment, the semiconductor chip 100 is a flash memory chip 100. During testing, the flash memory chip 100 can be operated in numerous test modes such as a reference current measurement mode, a reference array programming mode, and a reference array erase mode.

As described above, the reference array programming mode enables the threshold voltage $V_t$ of an array of reference cells of the flash memory chip 100 to be programmed. The reference array erase mode enables the threshold voltage $V_t$ of the array of reference cells of the flash memory chip 100 to be erased. Moreover, the reference current measurement mode enables the determination of the value of the threshold voltage $V_t$ of the array of reference cells of the flash memory chip 100 by measuring a current flowing through the reference cells.

Unlike the conventional procedures described above for transitioning between the reference array programming mode and the reference current measurement mode and for transitioning between the reference array erase mode and the reference current measurement mode, the circuits of the flash memory chip 100 facilitate enabling the reference current measurement mode within the reference array programming mode or the reference array erase mode. While in the conventional procedures the flash memory chip had to exit the reference array programming mode (if invoked) or the reference array erase mode (if invoked) before the flash memory chip could enter the reference current measurement mode, in the present invention the flash memory chip 100 simply disables the reference array programming mode (if invoked) or the reference array erase mode (if invoked). Then, the flash memory chip 100 enables the reference current measurement mode within the reference array programming mode (if invoked) or the reference array erase mode (if invoked).

More particularly, either the reference array programming mode or the reference array erase mode is invoked in the flash memory chip 100. This requires the application of high voltages and a test code to the flash memory chip 100. Within the reference array programming mode (if invoked), the state of the output enable bar signal (or /OE) is changed (or pulsed) from a first state to a second state to enable the reference current measurement mode while disabling the reference array programming mode. Similarly, within the reference array erase mode (if invoked), the state of the output enable bar signal (or /OE) is changed (or pulsed) from a first state to a second state to enable the reference current measurement mode while disabling the reference array erase mode. Thus, the reference current measurement mode is enabled without requiring the high voltages to be reset and without requiring the test code corresponding to the reference current measurement mode to be provided to the flash memory chip 100. This implementation leads to significant reduction in testing time for the flash memory chip 100.

Conversely, the state of the output enable bar signal (or /OE) is changed (or pulsed) from the second state to the first state to enable the reference array erase mode (if previously invoked) or the reference array programming mode (if previously invoked) while disabling the reference current measurement mode. Again, the reference current measurement mode is disabled without requiring the high voltages to be reapplied and without requiring the test code corresponding to the reference array erase mode or the reference array programming mode to be provided again to the flash memory chip 100. This implementation leads to significant reduction in testing time for the flash memory chip 100. In an embodiment, the first state is a logic "high" while the second state is a logic "low".

Referring to FIG. 1, several circuits facilitate operating the flash memory chip 100 in the reference current measurement mode from within the reference array erase mode without requiring the high voltages to be reset and without requiring the test code corresponding to the reference current measurement mode to be provided to the flash memory chip 100.

In particular, the test code corresponding to the reference array erase mode is coupled to the NAND gate 5. The NAND gate 5 outputs the mode signal REFNGSB corresponding to the reference array erase mode. The mode signal REFNGSB also is used to allow the flash memory chip 100 to operate in the test mode NGS rather than the reference array erase mode. Moreover, the NOR gate 10 determines whether the flash memory chip 100 operates in the reference array erase mode while the NOR gate 7 determines whether the flash memory chip 100 operates in the test mode NGS (Negative Gate Stress Mode). The mode signal REFNGSB, the signal A8B (which is the complement of the signal on the address pin A8 of the flash memory chip 100), and the signal OETB (which is the complement of the signal /OE as shown in the table 70) are inputted into the NOR gate 10. The signal REFERS (which is the output of NOR 10) and the signal NGS (which is the output of NOR gate 7) are inputted into the NOR gate 14. The NOR gate 14 outputs the signal REFNGSB2 which is inputted into NAND gate 16. The signal MER (which is the output of NAND gate 16) activates the support circuitry for the erase routine of the reference array erase mode. The signal MERB (which is the output of the inverter 18) is the complement of the signal MER.

Refocusing on NOR gate 10, the signal REFERS (which is the output of NOR gate 10) is inputted into inverter 12 which outputs the mode signal REFERSB for the reference array erase mode. Hence, the mode signals REFNGSB and REFERSB indicate the flash memory chip is operating in the reference array erase mode.

Moreover, the signal /OE (or output enable bar) is provided to the flash memory chip 100 via the input buffer and logic circuit 26 which outputs the signal OETB which is coupled to the input of the NOR gate 10 and to the inverter 50 which outputs the signal OETBB. The signal OETBB is the complement of signal OETB. The table 70 shows the interrelationships of signals /OE, OETBB, and OETB. The signal /OE is used to enable the output buffers (which drive the output pins) of the flash memory chip 100. In addition, within the reference array erase mode, the signal /OE is pulsed from a high state to a low state to enable the reference current measurement mode while disabling the reference array erase mode, as described above. Similarly, within the reference array programming mode, the signal /OE is pulsed from a high state to a low state to enable the reference current measurement mode while disabling the reference array programming mode, as described above.

Because the signal /OE is pulsed from a high state (inactive) to a low state (active) within the reference array programming mode or the reference array erase mode, the mode signal REFNGSB is inputted into NAND gate 20 which outputs the signal REFPGMER for disabling the output buffers of the flash memory chip 100 during the reference array erase mode. Similarly, the mode signal RFPGMB (outputted by the NAND gate 40) corresponding to the reference array programming mode is also inputted into NAND gate 20 which outputs the signal REFPGMER for disabling the output buffers of the flash memory chip 100 during the reference array programming mode.

Continuing with NAND gate 20, the output of NAND gate 20 is coupled to the inverter 22 which outputs the signal REFPGMERB which is inputted into NAND gate 24 which outputs the signal FT_APE for enabling the input buffer and logic circuit 26 which receives the signal /OE provided to the flash memory chip 100.

It should be understood that if in the name of a signal the letter "B" is the last letter to the right or "/" is the first or last character, the signal's activate state is the logic "low" while the signal's inactive state is the logic "high". Otherwise, the signal's activate state is the logic "high" while the signal's inactive state is the logic "low". For example, for signals MER and NGS, the activate is the logic "high" while the inactive state is the logic "low". Similarly, for signals REFNGSB, A8B, REFNGSB2, REFERSB, /OE, OETBB, and OETB, the activate state is the logic "low" while the inactive state is the logic "high".

Referring to FIG. 1, several circuits facilitate operating the flash memory chip 100 in the reference current measurement mode from within the reference array programming mode without requiring the high voltages to be reset and without requiring the test code corresponding to the reference current measurement mode to be provided to the flash memory chip 100.

In particular, the test code corresponding to the reference array programming mode is coupled to the NAND gate 40. The NAND gate 40 outputs the mode signal RFPGMB corresponding to the reference array programming mode. Moreover, the test code corresponding to the reference array programming mode and the signal OETBB are coupled to the NAND gate 42. The output of NAND gate 42 is coupled to the NAND gate 44. The output of NAND gate 44 is inputted into the inverter 46 which outputs the signal FTMB which activates the support circuitry for the programming routine of the reference array programming mode.

Moreover, the signal HWRESETB (or hardware reset bar signal) and the signal OETB are inputted into the OR gate 36. The output of OR gate 36 and the output of NAND gate 34 are inputted into the NAND gate 38 which outputs the signal VMEASB. If the signal VMEASB and the signal FTMB are both low at the same time during the reference array programming mode, the signal VMEASB supports the programming routine of the reference array programming mode. If the signal VMEASB is low and the signal FTMB is high during the reference array programming mode, the signal VMEASB is a mode signal corresponding to the reference current measurement mode.

The NAND gate 34 is used to control the generation of the mode signal VMEASB (outputted by the NAND gate 38) corresponding to the reference current measurement mode. During the reference array programming mode or the reference array erase mode, the OR gate 28, the NAND gate 30, and the inverter 32 control the generation of the mode signal VMEASB corresponding to the reference current measurement mode. However, the test code corresponding to the reference current measurement mode can be coupled to the NAND gate 52 to directly invoke the reference current measurement mode with the test code.

The mode signal REFNGSB (outputted by NAND gate 5) and the signal OETBB are inputted into the OR gate 28. The mode signal RFPGMB (outputted by NAND gate 40) and the output of OR gate 28 are inputted into NAND gate 30. The output of NAND gate 30 is inputted into inverter 32 whose output is coupled to the NAND gate 34.

Figure 2:
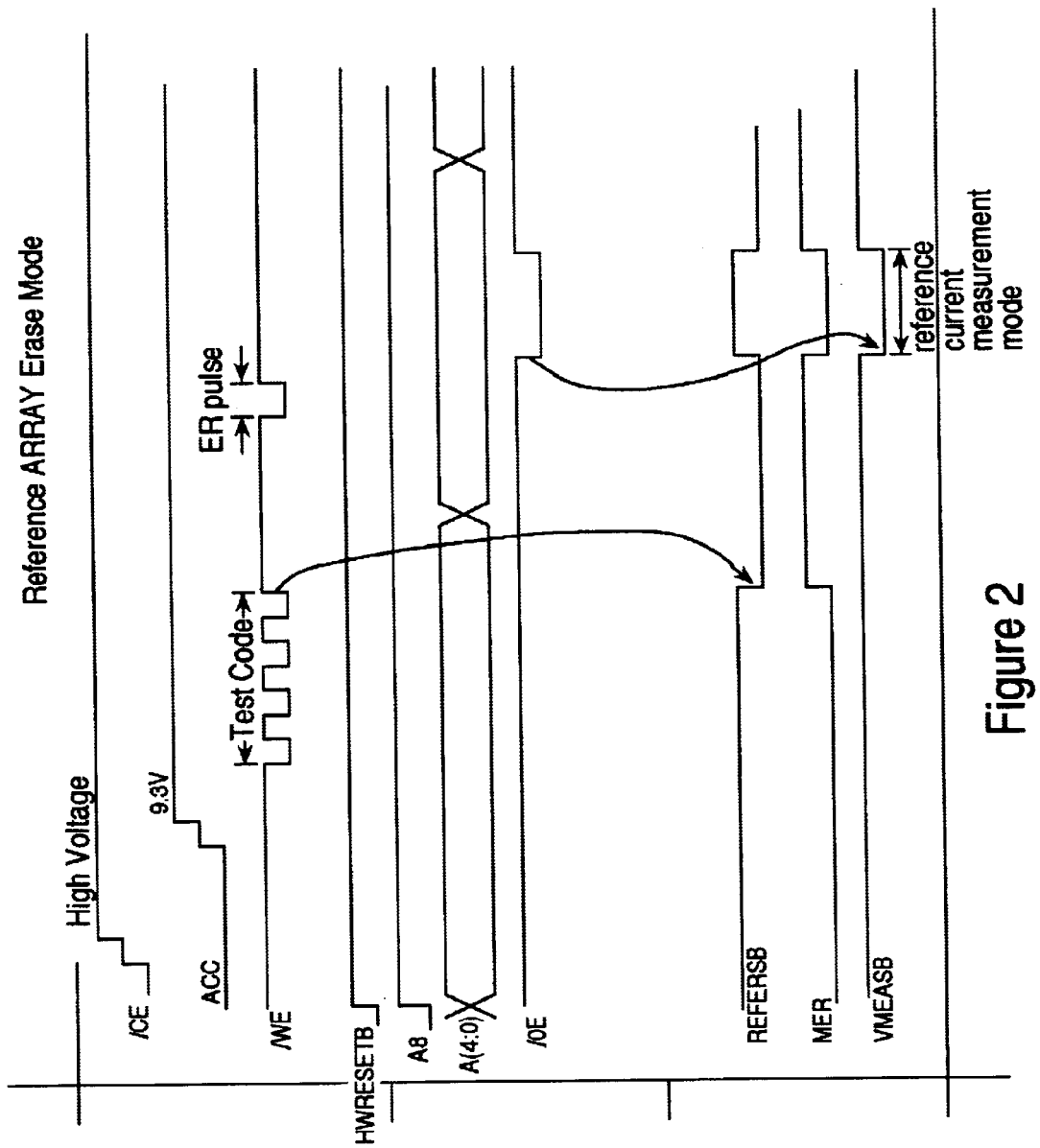
FIG. 2 illustrates a plurality of signal states during a reference array erase mode in a semiconductor chip in accordance with an embodiment of the present invention.

FIG. 2 illustrates a plurality of signal states during a reference array erase mode in a semiconductor chip in accordance with an embodiment of the present invention. Reference is made to FIG. 1.

In order to invoke the reference array erase mode in the flash memory chip 100, a high voltage is applied to the signal /CE (or chip enable bar) of the flash memory chip 100. Moreover, the signal /OE is placed in a high state and a test code corresponding to the reference array erase mode is provided to the flash memory chip 100. Also, the signal ACC of the flash memory chip 100 is raised to 9.3 volts after bringing the signal /CE to the high voltage. The signal ACC supplies the pwell/nwell voltage during the erase routine and is not regulated.

The signal /WE (or write enable bar) (shown in FIG. 2) is cycled four times to couple the test code to the NAND gate 5 (FIG. 1). Since the test code corresponding to the reference array erase mode was provided, the mode signal REFNGSB becomes low. Since the mode signal REFNGSB is low, the signal REFPGMER (output of NAND 20) becomes high so that to disable the output buffers of the flash memory chip 100 and the signal REFPGMERB (output of inverter 22) becomes low so that to cause signal FT_APE (output of NAND 24) to become high so that to enable the input buffer and logic circuit 26 which outputs the signal OETB. Since the signal /OE is high, the signal OETB is low as shown in table 70.

The signal A8 is high for the reference array erase mode. Hence, the signal A8B is low. Because the mode signal REFNGSB, the signal OETB, and the signal A8B are low, the output of NOR gate 10 becomes high causing the mode signal REFERSB for the reference array erase mode to become low as illustrated in FIG. 2. Since the mode signal REFNGSB is low, the signal REFNGSB2 (output of NOR gate 14) becomes low causing the signal MER (output of NAND gate 16) to become high as illustrated in FIG. 2 so that to activate the support circuitry for the erase routine of the reference array erase mode.

During the reference array erase mode, the mode signal RFPGMB (output of the NAND gate 40) corresponding to reference array programming mode is high. Additionally, the mode signal REFNGSB is low and the signal OETBB is high (since the signal /OE is high as illustrated in table 70). Thus, the output of inverter 32 is high. Since the test code corresponding to the reference current measurement array is not provided to the flash memory chip 100, the output of NAND gate 52 is high. Thus, the signal VMEAS (the output of NAND gate 34) is low. Moreover, during the reference array erase mode, the signal HWRESETB is high. The signal OETB is low since the signal /OE is high. Hence, since the signal HWRESETB is high, the signal OETB is low, and the signal VMEAS is low, the mode signal VMEASB corresponding to the reference current measurement mode is high as illustrated in FIG. 2, disabling the reference current measurement mode.

In the reference array erase mode, the erase pulse (ER pulse) width is controlled by the signal /WE. The internally generated negative voltage of −9.3 volts is used. The core cells of the flash memory chip 100 are not affected in the reference array erase mode. Some reference cells can be erased separately decoded by the address A(4:0)(FIG. 2). The erase time of the reference cells is determined by the time that the signal /WE is low, as illustrated by ER pulse in FIG. 2.

To enable the reference current measurement mode from within the reference array erase mode, the signal /OE is pulsed low, as illustrated in FIG. 2. Since signal /OE is low, the signal OETB becomes high and the signal OETBB becomes low. Since the signal OETB is high and the signals REFNGSB and A8B remain unchanged at low, the mode signal REFERSB (output of inverter 12) becomes high (inactive), disabling the reference array erase mode as illustrated in FIG. 2. Moreover, the signal REFNGSB2 becomes high (inactive) causing the signal MER (output of NAND gate 16) to become low (inactive) so that to inactivate the support circuitry for the erase routine of the reference array erase mode as illustrated in FIG. 2.

Moreover, since the mode signal REFNGSB remains low and the signal OETBB becomes low, the output of OR gate 28 becomes low causing the output of inverter 32 to become low. Since the test code corresponding to the reference current measurement array is not provided to the flash memory chip 100, the output of NAND gate 52 remains high. However, the signal VMEAS (output of NAND gate 34) becomes high causing the signal VMEASB (output of NAND gate 38) to become low, enabling the reference current measurement mode as illustrated in FIG. 2.

In the reference current measurement mode, each reference cell's gate voltage is internally ratioed to the correct level from the signal ACC. The drain currents are measured externally per reference cell at the required threshold voltage $V_t$ level.

After the reference current measurement mode is completed, the signal /OE is pulsed high, as illustrated in FIG. 2. Since signal /OE is high, the signal OETB becomes low and the signal OETBB becomes high. Since the signal OETB is low and the signals REFNGSB and A8B remain unchanged at low, the mode signal REFERSB (output of inverter 12) becomes low (active), enabling the reference array erase mode again as illustrated in FIG. 2. Moreover, the signal REFNGSB2 becomes low (active) causing the signal MER (output of NAND gate 16) to become high (active) so that to activate the support circuitry for the erase routine of the reference array erase mode as illustrated in FIG. 2.

Moreover, since the mode signal REFNGSB remains low and the signal OETBB becomes high, the output of OR gate 28 becomes high causing the output of inverter 32 to become high. Since the test code corresponding to the reference current measurement array is not provided to the flash memory chip 100, the output of NAND gate 52 remains high. However, the signal VMEAS (output of NAND gate 34) becomes low causing the signal VMEASB (output of NAND gate 38) to become high, disabling the reference current measurement mode as illustrated in FIG. 2. Since the reference array erase mode is enabled again, another erase pulse can be triggered via the signal /WE if needed.

In sum, the flash memory chip 100 can be operated in the reference current measurement mode from within the reference array erase mode without requiring the high voltages to be reset and without requiring the test code corresponding to the reference current measurement mode to be provided to the flash memory chip 100.

Figure 3:
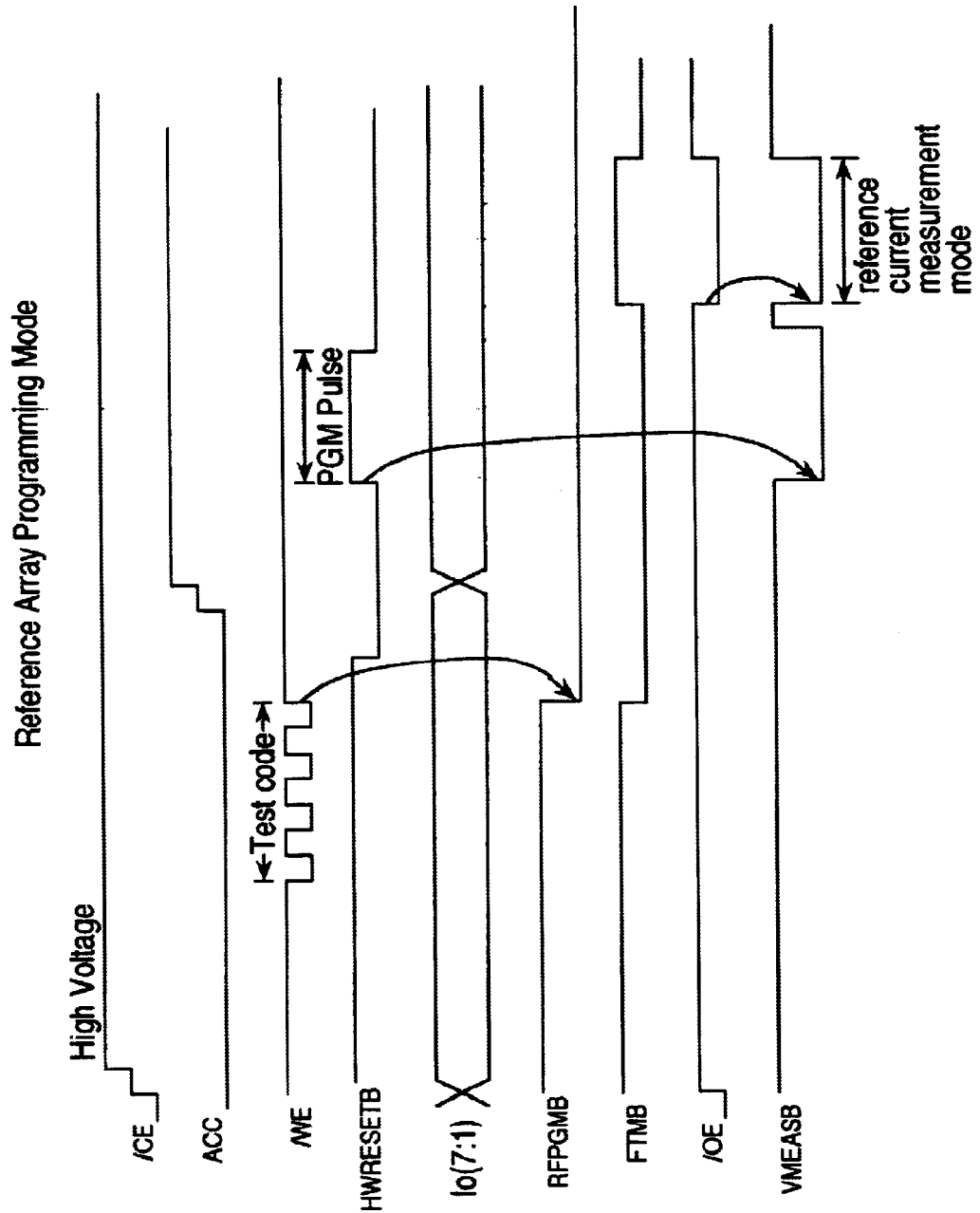
FIG. 3 illustrates a plurality of signal states during a reference array programming mode in a semiconductor chip in accordance with an embodiment of the present invention.

FIG. 3 illustrates a plurality of signal states during a reference array programming mode in a semiconductor chip in accordance with an embodiment of the present invention.

In order to invoke the reference array programming mode in the flash memory chip 100, a high voltage is applied to the signal /CE (or chip enable bar) of the flash memory chip 100. Moreover, the signal /OE is placed in a high state and a test code corresponding to the reference array programming mode is provided to the flash memory chip 100. Moreover, the signal HWRESETB is set high. The signal HWRESETB is used to control the program pulse width (PGM pulse as illustrated in FIG. 3). The signals IO(7:1) control which reference cells are programmed, as illustrated in FIG. 3.

The signal /WE (or write enable bar) (shown in FIG. 3) is cycled four times to couple the test code to the NAND gate 40 (FIG. 1). Since the test code corresponding to the reference array programming mode was provided, the mode signal RFPGMB becomes low (active) as illustrated in FIG. 3. Since the mode signal RFPGMB is low, the signal REFPGMER (output of NAND 20) becomes high so that to disable the output buffers of the flash memory chip 100 and the signal REFPGMERB (output of inverter 22) becomes low so that to cause signal FT_APE (output of NAND 24) to become high so that to enable the input buffer and logic circuit 26 which outputs the signal OETB. Since the signal /OE is high, the signal OETB is low and the signal OETBB is high as shown in table 70.

Because the signal OETBB is high and the test code corresponding to the reference array programming mode is coupled to the NAND gate 42, the output of NAND gate 42 becomes low causing the signal FTMB (output of NAND gate 44) to become low (active) as illustrated in FIG. 3, activating the support circuitry for the program routine of the reference array programming mode.

As illustrated in FIG. 3, after the signal /WE is cycled four times, the signal HWRESETB is set low. Then, the signal ACC of the flash memory chip 100 is raised to the desired programming voltage. The signal ACC provides the reference program gate voltage and can be in the range of 4 volts to 7 volts.

During the reference array programming mode, the mode signal REFNGSB (output of the NAND gate 5) corresponding to reference array erase mode is high. Additionally, the mode signal RFPGMB is low and the signal OETBB is high (since the signal /OE is high as illustrated in table 70). Thus, the output of inverter 32 is low. Since the test code corresponding to the reference current measurement array is not provided to the flash memory chip 100, the output of NAND gate 52 is high. Thus, the signal VMEAS (the output of NAND gate 34) is high. As illustrated in FIG. 3, after the signal /WE is cycled four times, the signal HWRESETB is set low. The signal OETB is low since the signal /OE is high. Hence, since the signal HWRESETB is low, the signal OETB is low, and the signal VMEAS is high, the mode signal VMEASB corresponding to the reference current measurement mode is high as illustrated in FIG. 3, disabling the reference current measurement mode.

In the reference array programming mode, the signal HWRESETB is set high again, triggering the programming pulse (PGM pulse) and causing the signal VMEASB (output of NAND gate 38) to become low for the duration of the programming pulse (PGM pulse) as illustrated in FIG. 3. Since both the signal FTMB and the signal VMEASB are low for the duration of the programming pulse (PGM pulse), the external programming voltages can be passed to the reference cell drain during the reference array programming mode. At the end of the programming pulse (PGM pulse) in the signal HWRESETB, the signal VMEASB becomes high again and the signal HWRESETB becomes low again, as illustrated in FIG. 3.

To enable the reference current measurement mode from within the reference array programming mode, the signal /OE is pulsed low, as illustrated in FIG. 3. Since signal /OE is low, the signal OETB becomes high and the signal OETBB becomes low. Since the signal OETBB is low, the output of NAND gate 42 becomes high causing the output of NAND gate 44 to become low. Moreover, the signal FTMB becomes high (inactive), disabling the support circuitry for the programming routine of the reference array programming mode as illustrated in FIG. 3.

Moreover, since the mode signal REFNGSB remains high and the signal OETBB becomes low, the output of OR gate 28 remains high. Since the mode signal RFPGMB remains low, the output of inverter 32 remains low. Since the test code corresponding to the reference current measurement array is not provided to the flash memory chip 100, the output of NAND gate 52 remains high. Thus, the signal VMEAS (output of NAND gate 34) remains high. However, since the signal OETB becomes high and the signal HWRESETB is low, the output of OR gate 36 becomes high causing the signal VMEASB (output of NAND gate 38) to become low (active), enabling the reference current measurement mode as illustrated in FIG. 3.

In the reference current measurement mode, each reference cell's gate voltage is internally ratioed to the correct level from the signal ACC. The drain currents are measured externally per reference cell at the required threshold voltage $V_t$ level.

After the reference current measurement mode is completed, the signal /OE is pulsed high, as illustrated in FIG. 3. Since signal /OE is high, the signal OETB becomes low and the signal OETBB becomes high. Since the signal OETB becomes low and the signal HWRESETB is low, the output of OR gate 36 becomes low causing the signal VMEASB (output of NAND gate 38) to become high (inactive), disabling the reference current measurement mode as illustrated in FIG. 3. Since the signal OETBB becomes high, the output of NAND gate 42 becomes low causing the output of NAND gate 44 to become high. Moreover, the signal FTMB becomes low (active), activating the support circuitry for the programming routine of the reference array programming mode as illustrated in FIG. 3. The signal VMEASB (output of NAND gate 38) will continue to be high until another programming pulse (PGM pulse) is issued via the signal HWRESETB.

In sum, the flash memory chip 100 can be operated in the reference current measurement mode from within the reference array programming mode without requiring the high voltages to be reset and without requiring the test code corresponding to the reference current measurement mode to be provided to the flash memory chip 100.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of enabling a reference current measurement mode in a semiconductor chip, said method comprising:
　a) invoking a reference array programming mode in said semiconductor chip;
　b) changing a state of a first signal of said semiconductor chip from a first state to a second state;
　c) in response to said step b), disabling said reference array programming mode; and
　d) in response to said step b), enabling said reference current measurement mode.

2. The method as recited in claim 1 further comprising:
　e) changing said state of said first signal from said second state to said first state;
　f) in response to said step e), disabling said reference current measurement mode; and
　g) in response to said step e), enabling said reference array programming mode.

3. The method as recited in claim 1 wherein said invoking comprises:
　applying one or more appropriate voltages to one or more inputs of said semiconductor chip; and
　providing a corresponding test code to said semiconductor chip.

4. The method as recited in claim 1 wherein said first signal is an output enable bar signal.

5. The method as recited in claim 1 wherein said semiconductor chip is a flash memory chip.

6. A method of enabling a reference current measurement mode in a semiconductor chip, said method comprising:
　a) invoking a reference array erase mode in said semiconductor chip;
　b) changing a state of a first signal of said semiconductor chip from a first state to a second state;
　c) in response to said step b), disabling said reference array erase mode; and
　d) in response to said step b), enabling said reference current measurement mode.

7. The method as recited in claim 6 further comprising:
　e) changing said state of said first signal from said second state to said first state;
　in response to said step e), disabling said reference current measurement mode; and
　g) in response to said step e), enabling said reference array erase mode.

8. The method as recited in claim 6 wherein said invoking comprises:
applying one or more appropriate voltages to one or more inputs of said semiconductor chip; and
providing a corresponding test code to said semiconductor chip.

9. The method as recited in claim 6 wherein said first signal is an output enable bar signal.

10. The method as recited in claim 6 wherein said semiconductor chip is a flash memory chip.

11. A semiconductor chip comprising:
an input for receiving a first signal;
a first circuit for generating a first mode signal corresponding to a reference array erase mode and for activating a first support circuitry for said reference array erase mode, wherein said first circuit receives a second signal which is a complement of said first signal;
a second circuit for generating a second mode signal corresponding to a reference array programming mode;
a third circuit for activating a second support circuitry for said reference array programming mode, wherein said third circuit receives a third signal which is a complement of said second signal;
a fourth circuit for generating a third mode signal corresponding to a reference current measurement mode, wherein said fourth circuit receives said second signal; and
a fifth circuit for controlling said fourth circuit, wherein said fifth circuit receives said first and second mode signals and said third signal, wherein a change in a state of said first signal from a first state to a second state disables a currently active one of said reference array erase mode and said reference array programming mode and enables said reference current measurement mode.

12. The semiconductor chip as recited in claim 11 wherein said first circuit comprises:
a first NAND gate which outputs said first mode signal;
a first NOR gate which receives said second signal and an output of said first NAND gate as inputs;
a second NOR gate which receives an output of said first NOR gate as an input;
a first inverter coupled to said output of said first NOR gate; and
a second NAND gate which receives an output of said second NOR gate as an input, wherein an output of said second NAND gate is coupled to said first support circuitry.

13. The semiconductor chip as recited in claim 11 wherein said second circuit comprises a NAND gate which outputs said second mode signal.

14. The semiconductor chip as recited in claim 11 wherein said third circuit comprises:
a first NAND gate which receives said third signal as an input;
a second NAND gate which receives an output of said first NAND gate as an input; and
a first inverter coupled to an output of said second NAND gate, wherein an output of said first inverter is coupled to said second support circuitry.

15. The semiconductor chip as recited in claim 11 wherein said fourth circuit comprises:
a first NAND gate which receives an output of said fifth circuit as an input;
a first OR gate which receives said second signal as an input;
a second NAND gate which receives an output of said first NAND gate and an output of said first OR gate as inputs, wherein said second NAND gate outputs said third mode signal.

16. The semiconductor chip as recited in claim 11 wherein said fifth circuit comprises:
a first OR gate which receives said third signal and said first mode signal as inputs;
a first NAND gate which receives said second mode signal and an output of said first OR gate as inputs; and
a first inverter coupled to an output of said first NAND gate, wherein an output of said first inverter is coupled to an input of said fourth circuit.

17. The semiconductor chip as recited in claim 11 further comprising an inverter including an input which receives said second signal and an output for outputting said third signal.

18. The semiconductor chip as recited in claim 11 further comprising a sixth circuit for generating a disabling signal to disable an output buffer circuitry, wherein said sixth circuit receives said first and second mode signals, wherein said sixth circuit comprises:
a first NAND gate which receives said first and second mode signals as inputs, wherein said first NAND gate outputs said disabling signal for disabling said output buffer circuitry; and
a first inverter coupled to an output of said first NAND gate.

19. The semiconductor chip as recited in claim 18 further including:
an input buffer coupled to said input that receives said first signal; and
a seventh circuit comprising a second NAND gate which receives an output of said first inverter as input, whereas an output of said second NAND gate is configured to enable said input buffer.

20. The semiconductor chip as recited in claim 11 wherein said first signal is an output enable bar signal.

21. The semiconductor chip as recited in claim 11 wherein said semiconductor chip is a flash memory chip.

* * * * *